(12) United States Patent
Hsu

(10) Patent No.: US 8,779,300 B2
(45) Date of Patent: *Jul. 15, 2014

(54) PACKAGING SUBSTRATE WITH CONDUCTIVE STRUCTURE

(75) Inventor: Shih-Ping Hsu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 273 days.

This patent is subject to a terminal disclaimer.

(21) Appl. No.: 13/355,311

(22) Filed: Jan. 20, 2012

(65) Prior Publication Data

US 2012/0181688 A1    Jul. 19, 2012

Related U.S. Application Data

(63) Continuation-in-part of application No. 12/175,348, filed on Jul. 17, 2008, now Pat. No. 8,101,866.

(30) Foreign Application Priority Data

Jul. 19, 2007    (TW) .............................. 96126297 A

(51) Int. Cl.
| | |
|---|---|
| H05K 1/11 | (2006.01) |
| H01L 29/40 | (2006.01) |
| H01L 23/48 | (2006.01) |
| H01L 23/00 | (2006.01) |
| H01L 23/498 | (2006.01) |

(52) U.S. Cl.
CPC ....... *H01L 24/00* (2013.01); *H01L 2224/32225* (2013.01); *H01L 23/49811* (2013.01); *H01L 2924/00* (2013.01)
USPC .................. 174/267; 257/737; 257/E23.068

(58) Field of Classification Search
CPC .............. H01L 2924/00; H01L 2224/32225; H01L 24/00; H01L 23/49811
USPC ..................... 174/267; 257/737, E23.068
See application file for complete search history.

(56) References Cited

U.S. PATENT DOCUMENTS

| | | | | | |
|---|---|---|---|---|---|
| 4,818,728 | A | * | 4/1989 | Rai et al. | 438/108 |
| 5,317,801 | A | * | 6/1994 | Tanaka et al. | 29/830 |
| 5,872,404 | A | * | 2/1999 | Lynch et al. | 257/781 |
| 6,077,765 | A | * | 6/2000 | Naya | 438/614 |
| 6,281,106 | B1 | * | 8/2001 | Higdon et al. | 438/613 |
| 6,372,622 | B1 | * | 4/2002 | Tan et al. | 438/612 |
| 6,426,281 | B1 | * | 7/2002 | Lin et al. | 438/612 |
| 6,555,296 | B2 | * | 4/2003 | Jao et al. | 430/312 |
| 6,559,540 | B2 | * | 5/2003 | Kawashima | 257/737 |
| 6,613,663 | B2 | * | 9/2003 | Furuya | 438/613 |
| 6,780,751 | B2 | * | 8/2004 | Fay | 438/613 |
| 6,818,545 | B2 | * | 11/2004 | Lee et al. | 438/614 |
| 6,849,534 | B2 | * | 2/2005 | Ho et al. | 438/614 |

(Continued)

*Primary Examiner* — William H Mayo, III
*Assistant Examiner* — Rhadames J Alonzo Miller
(74) *Attorney, Agent, or Firm* — Schmeiser, Olsen & Watts LLP

(57) ABSTRACT

A packaging substrate with conductive structure is provided, including a substrate body having at least one conductive pad on a surface thereof, a stress buffer metal layer disposed on the conductive pad and a thickness of the stress buffer metal layer being 1-20 μm, a solder resist layer disposed on the substrate body and having at least one opening therein for correspondingly exposing a portion of top surface of the stress buffer metal layer, a metal post disposed on a central portion of the surface of the stress buffer metal layer, and a solder bump covering the surfaces of the metal post.

17 Claims, 7 Drawing Sheets

(56) References Cited

U.S. PATENT DOCUMENTS

| | | | |
|---|---|---|---|
| 6,902,997 B2* | 6/2005 | Ho et al. | 438/614 |
| 6,917,106 B2* | 7/2005 | Datta | 257/737 |
| 6,945,084 B2* | 9/2005 | Bindernagel et al. | 72/224 |
| 6,956,292 B2* | 10/2005 | Fan et al. | 257/780 |
| 7,008,867 B2* | 3/2006 | Lei | 438/613 |
| 7,135,770 B2* | 11/2006 | Nishiyama et al. | 257/734 |
| 7,202,421 B2* | 4/2007 | Sugiura | 174/267 |
| 7,227,262 B2* | 6/2007 | Tanida et al. | 257/737 |
| 7,235,428 B2* | 6/2007 | Tanida et al. | 438/118 |
| 7,250,362 B2* | 7/2007 | Huang | 438/612 |
| 7,341,949 B2* | 3/2008 | Chien et al. | 438/689 |
| 7,358,174 B2* | 4/2008 | Mis | 438/612 |
| 7,382,049 B2* | 6/2008 | Ho et al. | 257/737 |
| 7,419,897 B2* | 9/2008 | Shih | 438/613 |
| 7,449,406 B2* | 11/2008 | Nishiyama et al. | 438/612 |
| 7,638,421 B2* | 12/2009 | Tanida et al. | 438/614 |
| 2001/0040290 A1* | 11/2001 | Sakurai et al. | 257/737 |
| 2003/0214795 A1* | 11/2003 | Sakuyama | 361/767 |
| 2004/0021234 A1* | 2/2004 | Shibata | 257/791 |
| 2004/0232562 A1* | 11/2004 | Hortaleza et al. | 257/778 |
| 2006/0094224 A1* | 5/2006 | Huang et al. | 438/612 |
| 2007/0281389 A1* | 12/2007 | Shih | 438/106 |
| 2007/0281557 A1* | 12/2007 | Shih | 439/876 |

* cited by examiner

PACKAGING SUBSTRATE WITH CONDUCTIVE STRUCTURE

CROSS-REFERENCE TO RELATED APPLICATIONS

This application is a Continuation-In-Part of and claiming the benefit from U.S. non-provisional patent application Ser. No. 12/175,348, filed on Jul. 17, 2008, entitled "PACKAGING SUBSTRATE WITH CONDUCTIVE STRUCTURE," which is incorporated herein by reference in its entirety.

BACKGROUND OF THE INVENTION

1. Field of the Invention

The present invention relates to packaging substrates with conductive structure, and more particularly, to a packaging substrate with conductive structure for electrical connection to a chip.

2. Description of Related Art

With existing flip-chip technology, a semiconductor chip is electrically connected to a packaging substrate, wherein electrode pads are provided on the active face (having integrated circuits thereon) of the semiconductor chip, and conductive pads corresponding in position to the electrode pads are provided on the packaging substrate. Soldering structures or other conductive adhesive materials formed between the electrode pads of the semiconductor chip and the conductive pads of the packaging substrate serve as electrical and mechanical connections between the packaging substrate and the semiconductor chip.

As shown in FIG. 1, the flip-chip technology involves forming a plurality of metal bumps 11 on electrode pads 12 of a semiconductor chip 13; forming a pre-soldering structure 14 consisting of a plurality of solders on the conductive pads 15 of a packaging substrate 16; reflowing the pre-soldering structure 14 to the corresponding metal bumps 11 at appropriate reflow temperature to form solder joints 17; and applying an underfill material 18 for coupling the semiconductor chip 13 and the packaging substrate 16 to ensure integrity and reliability of the electrical connection between the semiconductor chip 13 and the packaging substrate 16.

Referring to FIGS. 2A to 2F, a conventional method for fabricating an electrical connection structure of a packaging substrate is illustrated. The method comprises providing a substrate body 20 having a plurality of conductive pads 21 on a surface thereof. In this example, only one conductive pad 21 is shown for simplicity, as shown in FIG. 2A. Then, as shown in FIG. 2B, a solder resist layer 22 is formed on the substrate body 20 and the conductive pad 21. An opening 221 is formed in the solder resist layer 22 for exposing the surface of the conductive pad. 21 As shown in FIG. 2C, a stencil 23 covering the substrate body 20 is provided. The stencil 23 has an opening 231 corresponding in position to the conductive pad 21. As shown in FIG. 2D, a stencil printing process is performed to form a soldering material 24 in the opening 231 and the opening 221. As shown in FIG. 2E, the stencil 23 is removed. Finally, as shown in FIG. 2F, the soldering material 24 is reflowed to form a soldering bump 24', thereby providing electrical connections with the semiconductor chip in a flip-chip manner.

In the above structure applicable to a flip chip package, joints may experience stress caused by the difference in Coefficient of Thermal Expansion (CTE) between the chip and the substrate due to temperature variation during a thermal cycle process of fabrication or when used by users after completion of packaging. As a result, when line width and line pitch of the surface structures of the packaging substrate are reduced, joint strength decreases with joint size, disengagement or cracking of the joint between the soldering bump 24' and the conductive pad 21 may occur.

Thus, there is a need for a reliable connection structure of the packaging substrate to reduce the occurrence of disengagement or cracking.

SUMMARY OF THE INVENTION

In the light of foregoing drawbacks, an objective of the present invention is to provide a packaging substrate with conductive structure, for releasing thermal stresses and providing good electrical connection structure, thereby preventing the joints used for electrically connecting semiconductor chips from disengaging or cracking during thermal cycles or end use, thus increasing reliability of electrical connection.

In accordance with the above and other objectives, the present invention provides a packaging substrate with conductive structure, comprising: a substrate body having at least one conductive pad on a surface thereof; a stress buffer metal layer disposed on the conductive pad, a thickness of the stress buffer metal layer being 1-20 μm; a solder resist layer disposed on the substrate body and having at least one opening therein corresponding in position to the stress buffer metal layer, with the size of the opening smaller than that of the stress buffer metal layer; a metal post disposed on a central portion of the surface of the stress buffer metal layer; and a solder bump covering the surfaces of the metal post.

In the above structure, the metal post protrudes from the solder resist layer.

In the above structure, a top face of the metal post may be exposed from the solder bump.

In an embodiment of the present invention, the metal post fills the opening of the solder resist layer and is in full contact with the inner wall of the opening.

In another two embodiments of the present invention, the side surface of the metal post does not contact the inner wall of the opening, and either the opening is filled with the solder bump in full contact with the inner wall of the opening, or the solder bump does not contact the inner wall of the opening.

The present invention further provides a packaging substrate with conductive structure, comprising: a substrate body having at least one conductive pad on a surface thereof; a stress buffer metal layer disposed on the conductive pad, a thickness of the stress buffer metal layer being 1-20 μm; a solder resist layer disposed on the substrate body and having at least one opening therein corresponding in position to the stress buffer metal layer, with the size of the opening bigger than that of the stress buffer metal layer; a metal post disposed on a central portion of the surface of the stress buffer metal layer; and a solder bump covering the surfaces of the metal post.

In the above structure, the metal post protrudes from the solder resist layer.

In the above structure, a top face of the metal post may be exposed from the solder bump.

In the above structure, a side face of the metal post does not contact the inner wall of the opening of the solder resist layer.

The stress buffer metal layer is made of one selected from the group consisting of tin (Sn), lead (Pb), copper (Cu), silver (Ag), bismuth (Bi), zinc (Zn), indium (In), and an alloy of a combination of the above-mentioned. The metal post is made of one of copper (Cu), nickel/gold (Ni/Au), and chromium (Cr), copper (Cu) plus nickel/palladium/gold (Ni/Pd/Au) surface treatment, copper (Cu) plus gold (Au) surface treatment, and copper (Cu) plus nickel/gold (Ni/Au) surface treatment.

The various embodiments above may further include a first conductive seed-layer disposed between the substrate body and the conductive pad, and a second conductive seed-layer disposed between the metal post and the solder bump.

The melting point of the stress buffer metal layer is slightly lower than that of the solder bump.

Thus, a packaging substrate with conductive structure according to the various embodiments of the present invention releases thermal stresses during reflow processes by the stress buffer metal layer disposed between the metal post and the conductive pad. In addition, the solder bump and the metal post are provided to increase the height of the conductive structure, thereby reducing the possibility of joint cracks or disengagement during thermal cycles or end use.

BRIEF DESCRIPTION OF THE DRAWINGS

The present invention can be more fully understood by reading the following detailed description of the preferred embodiments, with reference made to the accompanying drawings, wherein:

FIG. 4E' is a cross-sectional view of an alternative embodiment of FIG. 4E;

FIG. 5D' is a cross-sectional view of an alternative embodiment of FIG. 5D;

FIG. 6E' is a cross-sectional view of an alternative embodiment of FIG. 6E.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Figure 1:
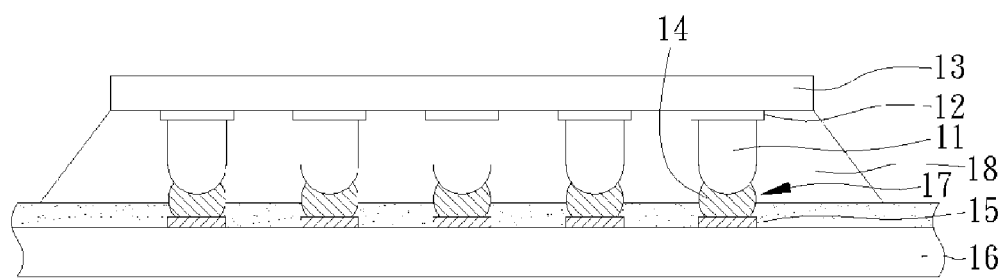
FIG. 1 (PRIOR ART) is a cross-sectional view of a conventional flip-chip structure.
Figure 2A:
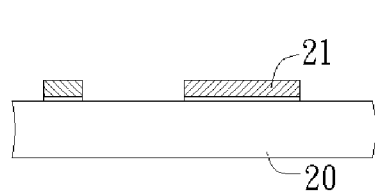
FIGS. 2A to 2F (PRIOR ART) are cross-sectional views illustrating a method for fabricating an electrical connection structure on a packaging substrate according to the prior art.
Figure 2B:
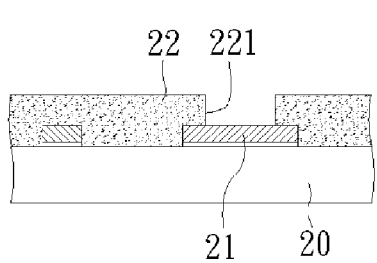
Figure 2C:
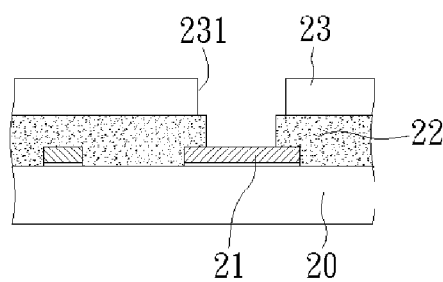
Figure 2D:
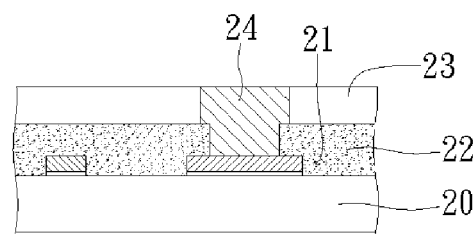
Figure 2E:
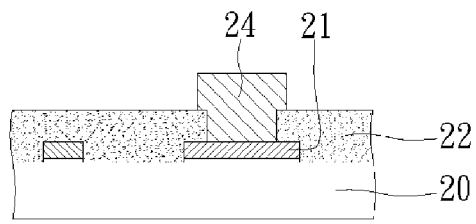
Figure 2F:
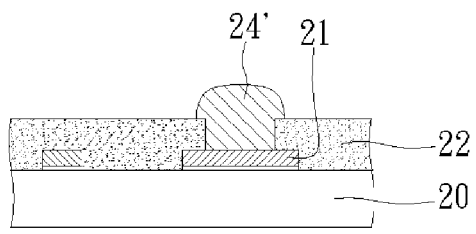
Figure 3A:
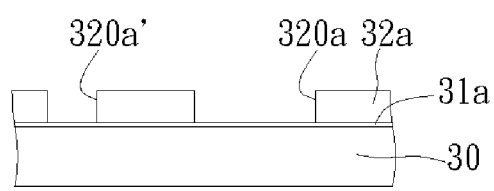
FIGS. 3A to 3N are cross-sectional views depicting a schematic flow chart of a method of fabrication according to a first embodiment of the present invention.
Figure 3E:
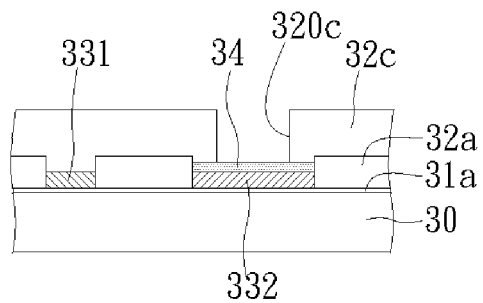
Figure 3B:
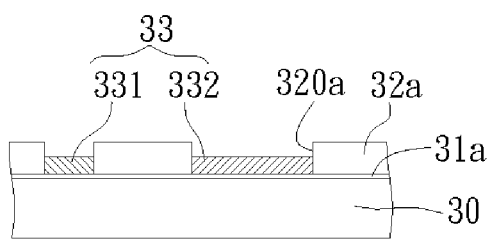
Figure 3F:
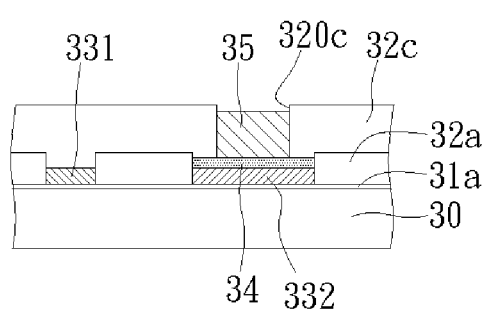
Figure 3C:
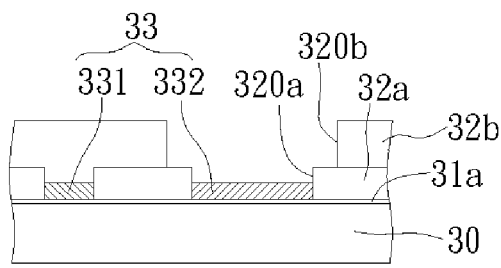
Figure 3G:
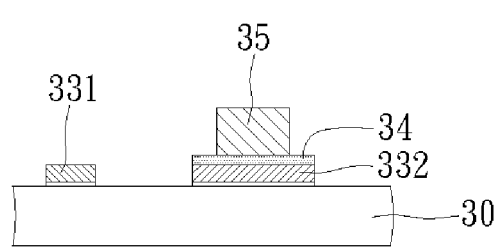
Figure 3D:
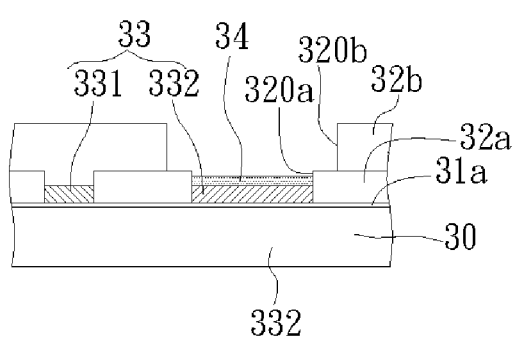
Figure 3H:
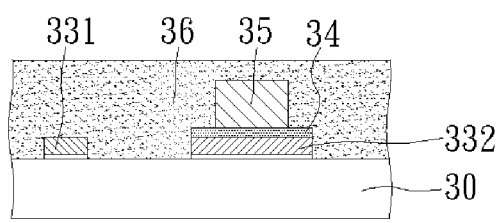
Figure 3L:
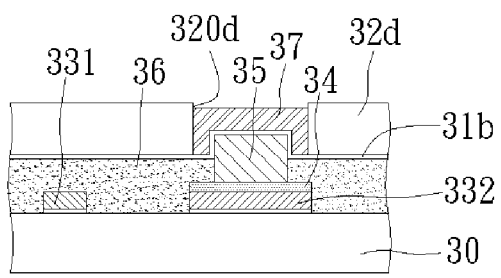
Figure 3I:
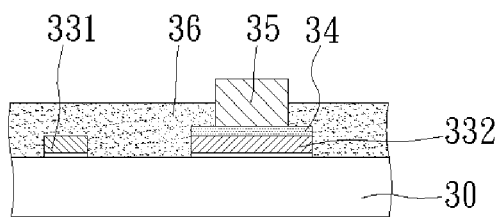
Figure 3M:
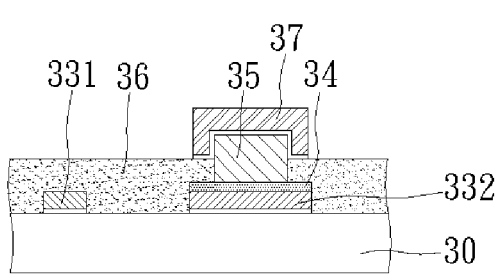
Figure 3J:
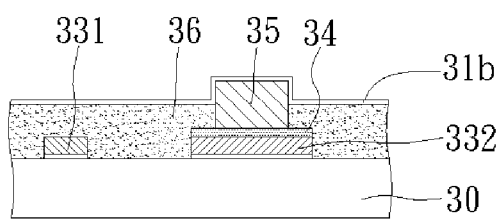
Figure 3N:
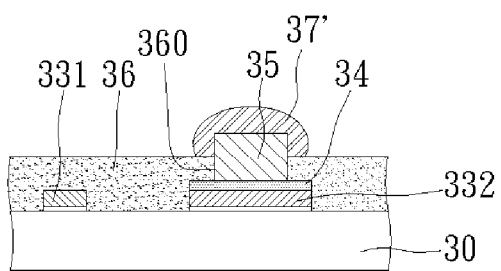

Referring to FIGS. 3A to 3N, cross-sectional views depicting a first embodiment of the present inventions are shown.

As shown in FIG. 3A, a substrate body 30 with a first conductive seed-layer 31a formed thereon is provided. A patterned resist layer 32a is formed on the surface of the first conductive seed-layer 31a and has a plurality of open areas 320a and 320a' to expose parts of the first conductive seed-layer 31a.

As shown in FIG. 3B, a circuit layer 33 is formed by electroplating by the first conductive seed-layer 31a within the open areas 320a and 320a'. The circuit layer 33 comprises a plurality of traces and conductive pads. For simplicity and exemplary purposes, only one trace 331 and one conductive pad 332 are shown in FIG. 3B.

As shown in FIG. 3C, a first resist layer 32b is formed on the patterned resist layer 32a. A first opening 320b corresponding in position to the opening 320a is formed in the first resist layer 32b to expose the conductive pad 332 in the open area 320a.

As shown in FIG. 3D, a stress buffer metal layer 34 is formed by electroplating on the surface of the conductive pad 332 within the open area 320a. The stress buffer metal layer 34 is made of one selected from the group consisting of tin (Sn), lead (Pb), copper (Cu), silver (Ag), bismuth (Bi), zinc (Zn), indium (In), and an alloy of a combination of the above-mentioned. A thickness of the stress buffer metal layer 34 is 1-20 μm.

As shown in FIG. 3E, the first resist layer 32b is removed, and a second resist layer 32c is formed on the patterned resist layer 32a. A second opening 320c smaller than the first opening 320b is formed in the second resist layer 32c to expose a portion of top surface of the stress buffer metal layer 34.

As shown in FIG. 3F, a metal post 35 is formed by electroplating on the surface of the stress buffer metal layer 34 exposed from the second opening 320c. The metal post 35 is made of one of copper (Cu), nickel/gold (Ni/Au), and chromium (Cr), copper (Cu) plus nickel/palladium/gold (Ni/Pd/Au) surface treatment, copper (Cu) plus gold (Au) surface treatment, and copper (Cu) plus nickel/gold (Ni/Au) surface treatment.

As shown in FIG. 3G, the second resist layer 32c, the patterned resist layer 32a and the first conductive seed-layer 31a thereunder are removed to expose the trace 331, the conductive pad 332, the stress buffer metal layer 34, and the metal post 35.

As shown in FIG. 3H, a solder resist layer 36 is formed on the surfaces of the substrate body 30, the trace 331, the conductive pad 332, the stress buffer metal layer 34, and the metal post 35.

As shown in FIG. 3I, the solder resist layer 36 is thinned down to a decreased thickness so as to expose a top face and a partial side face of the metal post 35.

As shown in FIG. 3J, a second conductive seed-layer 31b is formed on the surface of the solder resist layer 36 and the exposed surface of the metal post 35.

Figure 3K:
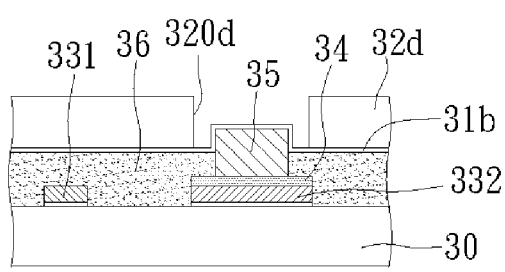

As shown in FIG. 3K, a third resist layer 32d is formed on the second conductive seed-layer 31b. A third opening 320d corresponding in position to the metal post 35 is formed in the third resist layer 32d to expose a part of the second conductive seed-layer 31b on the metal post 35 and the solder resist layer 36.

As shown in FIG. 3L, a solder material 37 is formed, by electroplating, in the third opening 320d via the second conductive seed-layer 31b.

As shown in FIG. 3M, the third resist layer 32d and the second conductive seed-layer 31b thereunder are removed so that the solder material 37 covers the exposed side face and the top face of the metal post 35.

As shown in FIG. 3N, the solder material 37 is reflowed to form a solder bump 37' for electrical connection with other electronic devices, such as semiconductor chips.

The melting point of the stress buffer metal layer 34 is slightly lower than that of the solder bump 37'.

Referring to FIG. 3N, the present invention further provides a packaging substrate with conductive structure, comprising: a substrate body 30 having at least one conductive pad 332 on a surface thereof; a stress buffer metal layer 34 disposed on the conductive pad 332; a solder resist layer 36 disposed on the substrate body 30 and having at least one opening 360 therein corresponding in position to the stress buffer metal layer 34, with the size of the opening 360 smaller than that of the stress buffer metal layer 34; a metal post 35 disposed on a central portion of the surface of the stress buffer metal layer 34, wherein the metal post 35 protrudes from the solder resist layer 36, fills the opening 360 in the solder resist layer 36, and is in full contact with the inner wall of the opening 360; and a solder bump 37' covering the surfaces of the metal post 35.

During a reflow process performed to provide electrical connection to a semiconductor chip, the stress buffer metal layer 34 disposed between the metal post 35 and the conductive pad 332 softens and releases thermal stresses. In addition, the solder bump 37' and the metal post 35 are provided to increase the height of the conductive structure, thereby reducing the possibility of joint cracks or disengagement.

Second Embodiment

Referring to FIGS. 4A to 4E, cross-sectional views depicting a second embodiment of the present invention are shown. The second embodiment is different from the first embodiment in that the solder resist layer is formed with an opening bigger than the stress buffer metal layer in size.

Figure 4A:
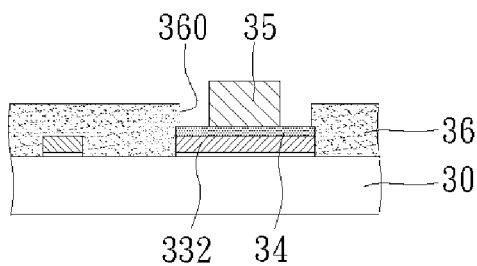
FIGS. 4A to 4E are cross-sectional views depicting a schematic flow chart of a method of fabrication according to a second embodiment of the present invention.

As shown in FIG. 4A, a structure similar to the one shown in FIG. 3I is provided. An opening 360 is formed in the solder resist layer 36 to expose a portion of the top surface of the stress buffer metal layer 34 and the surfaces of the metal post 35.

Figure 4D:
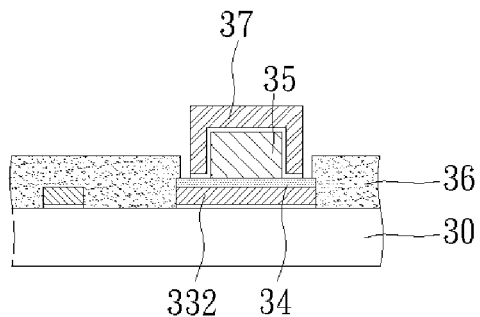
Figure 4B:
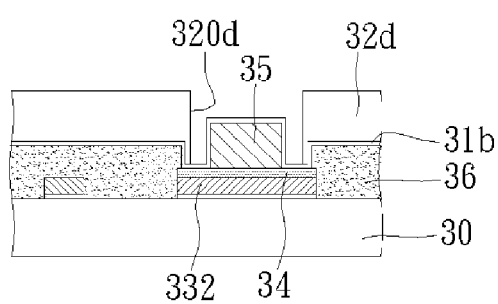

As shown in FIG. 4B, a second conductive seed-layer 31b is formed on the solder resist layer 36, a portion of the top surface of the stress buffer metal layer 34, and the surface of the metal post 35. A third resist layer 32d is formed on the second conductive seed-layer 31b and having a third opening 320d formed therein to expose a part of the second conductive seed-layer 31b on the metal post 35 and the stress buffer metal layer 34.

Figure 4E:
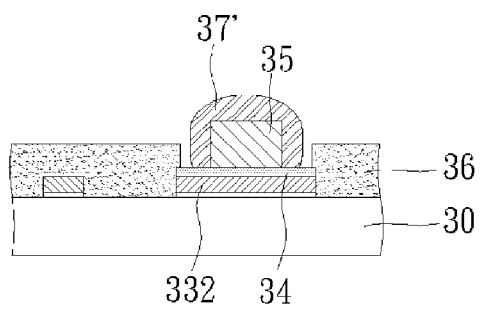
Figure 4C:
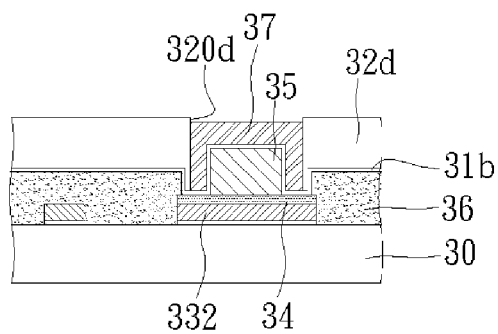
Figure 4E:
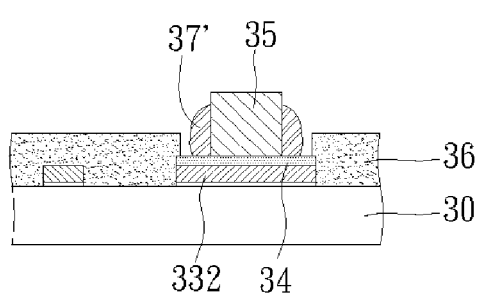

As shown in FIG. 4C, a solder material 37 is formed, by electroplating, in the third opening 320d via the second conductive seed-layer 31b.

As shown in FIG. 4D, the third resist layer 32d and the second conductive seed-layer 31b thereunder are removed so that the solder material 37 covers the side face and the top face of the metal post 35.

As shown in FIG. 4E, the solder material 37 is reflowed to form a solder bump 37' for electrical connection with other electronic devices, such as semiconductor chips.

Referring to FIG. 4E', the third resist layer 32d can also be formed on the top face of the metal post 35 (not shown), so that the solder bump 37 is not formed on the top face of the metal post 35. After reflowing, the solder bump 37' does not cover the top face of the metal post 35, and the metal post 35 is exposed from the solder bump 37'.

The present invention further provides a packaging substrate with conductive structure, comprising: a substrate body 30 having at least one conductive pad 332 on a surface thereof; a stress buffer metal layer 34 disposed on the conductive pad 332; a solder resist layer 36 disposed on the substrate body 30 and having at least one opening 360 therein corresponding in position to the stress buffer metal layer 34, with the size of the opening 360 smaller than that of the stress buffer metal layer 34; a metal post 35 disposed on a central portion of the surface of the stress buffer metal layer 34, wherein the metal post 35 protrudes from the solder resist layer 36, and the side face of the metal post 35 does not contact the inner wall of the opening 360 in the solder resist layer 36; and a solder bump 37' covering the surfaces of the exposed metal posts 35, as shown in FIG. 4E. Alternatively, the top face of the metal post 35 may be exposed from the solder bump 37', as shown in FIG. 4E'.

Third Embodiment

Referring to FIGS. 5A to 5D, cross-sectional views depicting a third embodiment of the present invention are shown. The third embodiment is different from the previous embodiment in that the solder bump not only covers the metal post but also completely fills the opening in the solder resist layer. The method of fabrication is similar to the second embodiment, and it will not be further discussed.

Figure 5A:
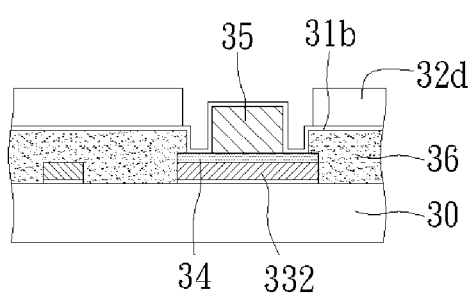
FIGS. 5A to 5D are cross-sectional views depicting a schematic flow chart of a method of fabrication according to a third embodiment of the present invention.
Figure 5D:
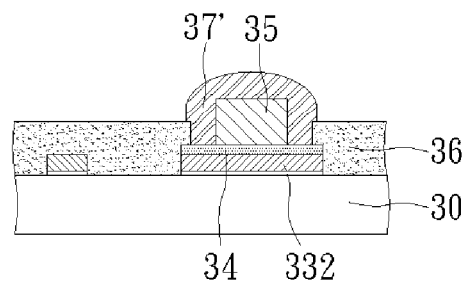
Figure 5B:
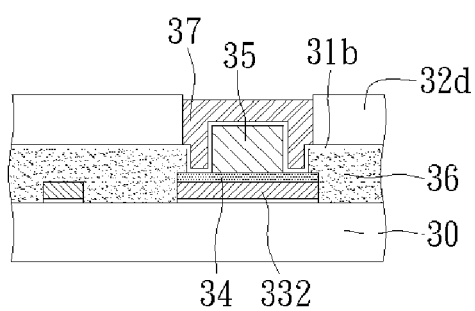
Figure 5D:
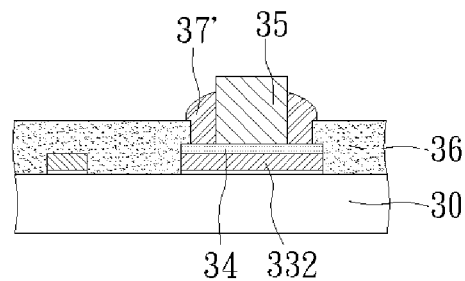
Figure 5C:
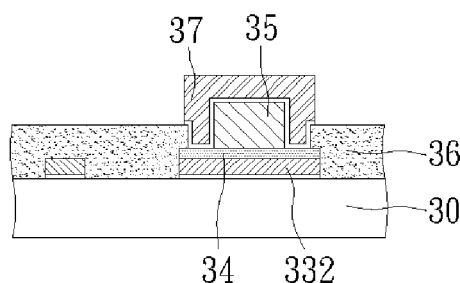

The present invention further provides a packaging substrate with conductive structure, comprising: a substrate body 30 having at least one conductive pads 332 on a surface thereof; a stress buffer metal layer 34 disposed on the conductive pad 332, a thickness of the stress buffer metal layer 34 being 1-20 μm; a solder resist layer 36 disposed on the substrate body 30 and having at least one opening 360 therein corresponding in position to the stress buffer metal layer 34, with the size of the opening 360 smaller than that of the stress buffer metal layer 34; a metal post 35 disposed on a central portion of the surface of the stress buffer metal layer 34, wherein the metal post 35 protrudes from the solder resist layer 36, and the side face of the metal post 35 does not contact the inner wall of the opening 360 in the solder resist layer 36; and a solder bump 37' covering the metal post 35 and filling the opening 360 in the solder resist layer 36, such that the solder bump 37' is in full contact with the inner wall of the opening 360, as shown in FIG. 5D. Alternatively, the top face of the metal post 35 may be exposed from the solder bump 37', as shown in FIG. 5D'.

Fourth Embodiment

Referring to FIGS. 6A to 6E, cross-sectional views depicting a fourth embodiment of the present invention are shown. The fourth embodiment is different from the previous embodiment in that the opening in the solder resist layer is bigger than the stress buffer metal layer 34 in size. The method of fabrication is similar to the second embodiment, and it will not be further discussed.

Figure 6A:
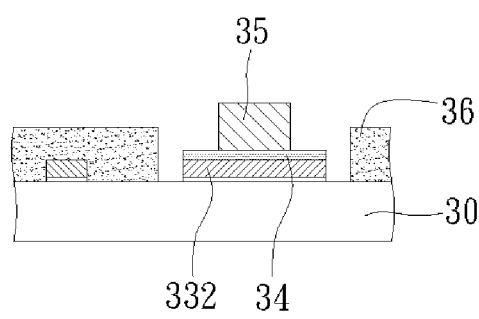
FIGS. 6A to 6E are cross-sectional views depicting a schematic flow chart of a method of fabrication according to a fourth embodiment of the present invention.
Figure 6D:
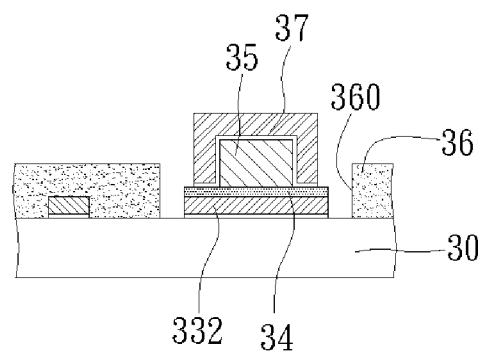
Figure 6B:
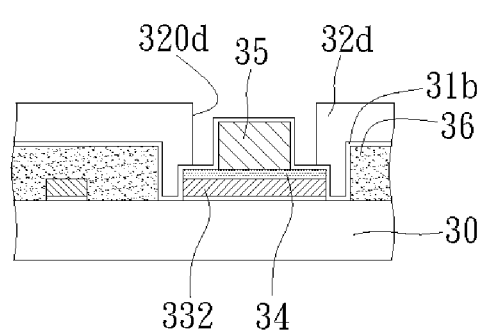
Figure 6E:
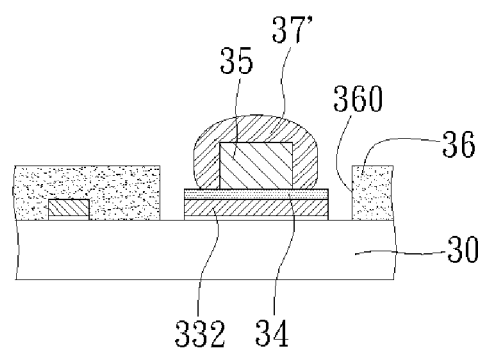
Figure 6C:
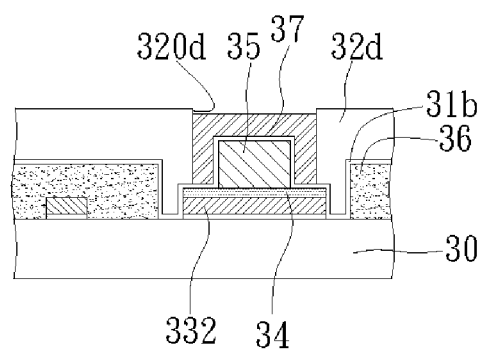
Figure 6E:
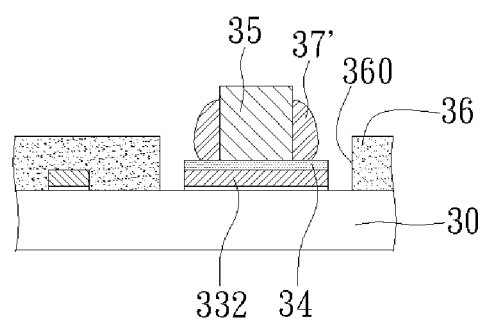

The present invention further provides a packaging substrate with conductive structure, comprising: a substrate body 30 having at least one conductive pad 332 on a surface thereof; a stress buffer metal layer 34 disposed on the conductive pad 332, a thickness of the stress buffer metal layer 34 being 1-20 μm; a solder resist layer 36 disposed on the substrate body 30 and having at least one opening 360 therein corresponding in position to the stress buffer metal layer 34, with the size of the opening 360 bigger than that of the stress buffer metal layer 34; a metal post 35 disposed on a central portion of the surface of the stress buffer metal layer 34 and protruding from the solder resist layer 36; and a solder bump 37' covering the surfaces of the metal post 35, as shown in FIG. 6E. Alternatively, a top face of the metal post 35 may be exposed from the solder bump 37', as shown in FIG. 6E'.

A packaging substrate with conductive structure according to the various embodiments of the present invention utilizes the stress buffer metal layer formed between the conductive pad and the metal post to release thermal stresses, and utilizes the metal post and the solder bump to increase the height of the conductive structure, thereby providing a good electrical connection structure and preventing disengagement or cracking of joints electrically connected to semiconductor chips during thermal cycles or end use.

The above embodiments are only used to illustrate the principles of the present invention, and they should not be construed as to limit the present invention in any way. The above embodiments can be modified by those with ordinary skills in the art without departing from the scope of the present invention as defined in the following appended claims.

What is claimed is:

1. A packaging substrate with conductive structure, comprising:
    a packaging substrate body having at least one conductive pad on a surface thereof;
    a stress buffer metal layer disposed on the conductive pad for releasing thermal stresses by the stress buffer metal layer during reflow processes, wherein the stress buffer metal layer is made of one selected from the group consisting of tin (Sn), lead (Pb), copper (Cu), silver (Ag), bismuth (Bi), zinc (Zn), indium (In), and an alloy of a combination of the above-mentioned, and a thickness of the stress buffer metal layer is 1-20 μm;
    a solder resist layer disposed on the packaging substrate body and having at least one opening therein corresponding in position to the stress buffer metal layer, with a size of the opening smaller than that of the stress buffer metal layer;
    a metal post disposed on a central portion of the stress buffer metal layer for releasing thermal stresses by the metal post and the stress buffer metal layer during end use; and
    a solder bump covering the metal post.

2. The packaging substrate of claim 1, wherein a melting point of the stress buffer metal layer is slightly lower than that of the solder bump.

3. The packaging substrate of claim 1, wherein the metal post is made of one of copper (Cu), nickel/gold (Ni/Au), chromium (Cr), copper (Cu) plus nickel/palladium/gold (Ni/Pd/Au) surface treatment, copper (Cu) plus gold (Au) surface treatment, and copper (Cu) plus nickel/gold (Ni/Au) surface treatment.

4. The packaging substrate of claim 1, further comprising a first conductive seed-layer disposed between the packaging substrate body and the conductive pad.

5. The packaging substrate of claim 1, further comprising a second conductive seed-layer disposed between the metal post and the solder bump.

6. The packaging substrate of claim 1, wherein the metal post protrudes from the solder resist layer.

7. The packaging substrate of claim 1, wherein the metal post fills the opening in the solder resist layer and is in full contact with the inner wall of the opening.

8. The packaging substrate of claim 1, wherein the side face of the metal post does not contact the inner wall of the opening in the solder resist layer.

9. The packaging substrate of claim 8, wherein the solder bump fills the opening in the solder resist layer and is in full contact with the inner wall of the opening.

10. The packaging substrate of claim 1, wherein a top face of the metal post is exposed from the solder bump.

11. A packaging substrate with conductive structure, comprising:
    a packaging substrate body having at least one conductive pad on a surface thereof;
    a stress buffer metal layer disposed on the conductive pad for releasing thermal stresses by the stress buffer metal layer during reflow processes, wherein the stress buffer metal layer is made of one selected from the group consisting of tin (Sn), lead (Pb), copper (Cu), silver (Ag), bismuth (Bi), zinc (Zn), indium (In), and an alloy of a combination of the above-mentioned, and a thickness of the stress buffer metal layer is 1-20 μm;
    a solder resist layer disposed on the packaging substrate body and having at least one opening therein corresponding in position to the stress buffer metal layer, with a size of the opening bigger than that of the stress buffer metal layer;
    a metal post disposed on a central portion of the stress buffer metal layer for releasing thermal stresses by the metal post and the stress buffer metal layer during end use; and
    a solder bump covering the metal post.

12. The packaging substrate of claim 11, wherein a melting point of the stress buffer metal layer is slightly lower than that of the solder bump.

13. The packaging substrate of claim 11, wherein the metal post is made of one of copper (Cu), nickel/gold (Ni/Au), chromium (Cr), copper (Cu) plus nickel/palladium/gold (Ni/Pd/Au) surface treatment, copper (Cu) plus gold (Au) surface treatment, and copper (Cu) plus nickel/gold (Ni/Au) surface treatment.

14. The packaging substrate of claim 11, further comprising a first conductive seed-layer disposed between the packaging substrate body and the conductive pad.

15. The packaging substrate of claim 11, further comprising a second conductive seed-layer disposed between the metal post and the solder bump.

16. The packaging substrate of claim 11, wherein the metal post protrudes from the solder resist layer.

17. The packaging substrate of claim 11, wherein a top face of the metal post is exposed from the solder bump.

* * * * *